(12) United States Patent
Kamitsubo et al.

(10) Patent No.: US 11,924,980 B2
(45) Date of Patent: Mar. 5, 2024

(54) METHOD FOR MANUFACTURING MULTILAYER SUBSTRATE AND MULTILAYER SUBSTRATE

(71) Applicant: Murata Manufacturing Co., Ltd., Nagaokakyo (JP)

(72) Inventors: Yusuke Kamitsubo, Nagaokakyo (JP); Tomohiro Furumura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 92 days.

(21) Appl. No.: 17/575,717

(22) Filed: Jan. 14, 2022

(65) Prior Publication Data

US 2022/0141966 A1    May 5, 2022

Related U.S. Application Data

(63) Continuation of application No. PCT/JP2020/030062, filed on Aug. 5, 2020.

(30) Foreign Application Priority Data

Aug. 8, 2019 (JP) .................................. 2019-146236
Mar. 31, 2020 (JP) .................................. 2020-063451

(51) Int. Cl.
  *H05K 1/02* (2006.01)
  *H05K 1/03* (2006.01)
  *H05K 3/46* (2006.01)

(52) U.S. Cl.
  CPC ......... *H05K 3/4635* (2013.01); *H05K 1/0277* (2013.01); *H05K 1/036* (2013.01);
  (Continued)

(58) Field of Classification Search
  CPC ................. H05K 1/0277; H05K 1/036; H05K 2201/0141; H05K 2201/015;
  (Continued)

(56) References Cited

U.S. PATENT DOCUMENTS

2006/0278963 A1    12/2006  Harada et al.
2011/0051386 A1*    3/2011  Nagasawa ......... H01L 23/49827
                                                        174/262
(Continued)

FOREIGN PATENT DOCUMENTS

JP    2003008225 A        1/2003
JP    2004179440 A  *     6/2004
(Continued)

OTHER PUBLICATIONS

JP 2004/179440 A Translation (Year: 2023).*
WO 2018/211992 A1 Translation (Year: 2023).*
Official Communication issued in International Patent Application No. PCT/JP2020/030062, dated Oct. 20, 2020.

*Primary Examiner* — Timothy J Thompson
*Assistant Examiner* — John B Freal
(74) *Attorney, Agent, or Firm* — Keating & Bennett, LLP

(57) ABSTRACT

A method for manufacturing a multilayer substrate including first and second insulating resin base material layers including different materials, includes configuring a conductor film-attached insulating resin base material with a conductor film on the first insulating resin base material layer, or a second conductor film-attached insulating resin base material with a conductor film on a main surface of the first insulating resin base material layer including a main surface of a stacked body including at least the first insulating resin base material layer, and stacking the first or second conductor film-attached insulating resin base material and another base material layer such that the conductor film is in contact with the second insulating resin base material layer. An adhesion strength of the first insulating resin base material layer to the conductor film is higher than an adhesion strength of the second insulating resin base material layer to the conductor film.

10 Claims, 13 Drawing Sheets

(52) U.S. Cl.
 CPC ... *H05K 3/4688* (2013.01); *H05K 2201/0141* (2013.01); *H05K 2201/015* (2013.01); *H05K 2201/0195* (2013.01); *H05K 2201/09827* (2013.01)

(58) Field of Classification Search
 CPC . H05K 2201/0195; H05K 2201/09827; H05K 2201/0129
 See application file for complete search history.

(56) References Cited

U.S. PATENT DOCUMENTS

| | | | |
|---|---|---|---|
| 2013/0306358 A1* | 11/2013 | Ohmori | H05K 3/281 |
| | | | 156/60 |
| 2017/0187087 A1 | 6/2017 | Baba et al. | |
| 2019/0090359 A1 | 3/2019 | Ito | |
| 2020/0176341 A1 | 6/2020 | Sasaki | |
| 2020/0315002 A1* | 10/2020 | Nakamura | H05K 3/4652 |
| 2022/0151065 A1* | 5/2022 | Kamitsubo | B29C 43/18 |

FOREIGN PATENT DOCUMENTS

| | | | |
|---|---|---|---|
| JP | 2006-344828 A | 12/2006 | |
| JP | 2009277623 A | 11/2009 | |
| JP | 2016164882 A | 9/2016 | |
| JP | 2019067864 A | 4/2019 | |
| WO | 2009065543 A1 | 5/2009 | |
| WO | 2016/047540 A1 | 3/2016 | |
| WO | 2018155089 A1 | 8/2018 | |
| WO | 2018/211992 A1 | 11/2018 | |
| WO | WO-2018211992 A1 * | 11/2018 | ......... H01L 21/4846 |

\* cited by examiner

\# METHOD FOR MANUFACTURING MULTILAYER SUBSTRATE AND MULTILAYER SUBSTRATE

CROSS REFERENCE TO RELATED APPLICATIONS

This application claims the benefit of priority to Japanese Patent Application No. 2019-146236 filed on Aug. 8, 2019 and Japanese Patent Application No. 2020-063451 filed on Mar. 31, 2020, and is a Continuation Application of PCT Application No. PCT/JP2020/030062 filed on Aug. 5, 2020. The entire contents of each application are hereby incorporated herein by reference.

BACKGROUND OF THE INVENTION

1. Field of the Invention

The present invention relates to a method for manufacturing a multilayer substrate formed by stacking a plurality of insulating resin base materials, and a multilayer substrate.

2. Description of the Related Art

In the related art, a multilayer substrate configured by stacking and thermocompression-bonding insulating resin base materials on which conductor patterns are formed is known.

For example, WO 2016/047540 A discloses a multilayer substrate including two insulating resin base material layers each made of different materials.

As compared with a case where a multilayer substrate is configured by stacking insulating resin base materials all of which are the same material, there is a specific problem in a case where a multilayer substrate is configured by stacking two insulating resin base material layers having different materials. For example, when a conductor pattern is disposed between a first insulating resin base material layer and a second insulating resin base material layer made of different materials, the adhesion strength of the first insulating resin base material layer to the conductor pattern and the adhesion strength of the second insulating resin base material layer to the conductor pattern are different. Therefore, depending on the arrangement, desired electrical characteristics may not be obtained due to peeling of the conductor pattern at the time of stacking or deviation from the original position in a stacked body as the insulating resin base material layer flows.

SUMMARY OF THE INVENTION

Preferred embodiments of the present invention provide methods for manufacturing, in multilayer substrates each including two insulating resin base material layers, and multilayer substrates in each of which positional deviation of a conductor pattern is reduced or prevented and electrical characteristics are highly stable, and further provide multilayer substrates in each of which positional deviation of a conductor pattern is reduced or prevented and electrical characteristics are highly stable.

A method for manufacturing a multilayer substrate according to a preferred embodiment of the present disclosure includes a first insulating resin base material layer and a second insulating resin base material layer each including different materials, and the method includes one of configuring a first conductor film-attached insulating resin base material with a conductor film formed on the first insulating resin base material layer, or configuring a second conductor film-attached insulating resin base material with a conductor film formed on a main surface of the first insulating resin base material layer including a main surface of a stacked body in the stacked body including at least the first insulating resin base material layer, stacking the first conductor film-attached insulating resin base material or the second conductor film-attached insulating resin base material and a different base material layer such that the conductor film is in contact with the second insulating resin base material layer, and thermocompression-bonding the first conductor film-attached insulating resin base material or the second conductor film-attached insulating resin base material and the different base material layer, and an adhesion strength of the first insulating resin base material layer to the conductor film is higher than an adhesion strength of the second insulating resin base material layer to the conductor film.

According to the above-described manufacturing method, in the stacking the first conductor film-attached insulating resin base material or the second conductor film-attached insulating resin base material, the conductor film is not peeled off from the first insulating resin base material layer, and a multilayer substrate with less positional deviation of the conductor film in the stacked body is obtained.

A multilayer substrate according to a preferred embodiment of the present disclosure includes a first insulating resin base material layer and a second insulating resin base material layer each including different materials, the second insulating resin base material layer and the first insulating resin base material layer on which a conductor film is provided are stacked, wherein an adhesion strength between the first insulating resin base material layer and the conductor film is higher than an adhesion strength between the second insulating resin base material layer and the conductor film.

With the above-described structure, it is possible to obtain a multilayer substrate having stable electrical characteristics with less positional deviation of the conductor film in a stacked body.

According to preferred embodiments of the present invention, in multilayer substrates each including two insulating resin base material layers, it is possible to obtain multilayer substrates in each of which positional deviation of a conductor pattern is reduced or prevented and electrical characteristics are highly stable.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
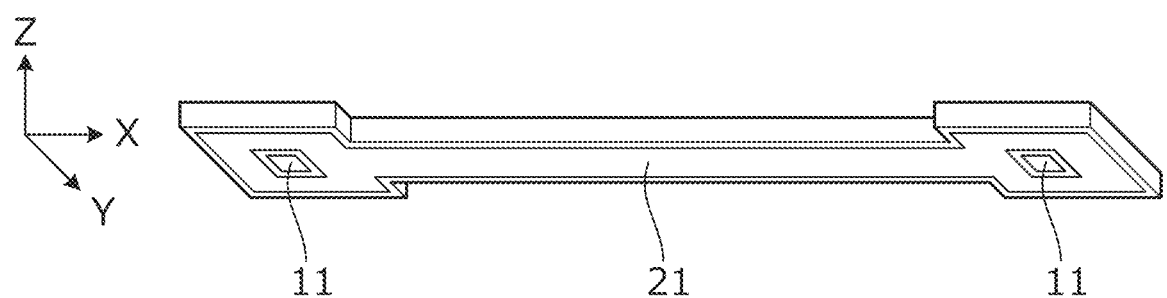
FIG. 1 is a perspective view of a multilayer substrate 101 according to a first preferred embodiment of the present invention.

Hereinafter, preferred embodiments of the present invention will be described with reference to the drawings. In the drawings, the same or corresponding portions are denoted by the same reference numerals. In consideration of the description of main points or ease of understanding, preferred embodiments are divided, but partial replacement or combination of configurations illustrated in different preferred embodiments is possible. In the second and subsequent preferred embodiments, descriptions of matters common to the first preferred embodiment will be omitted, and only different points will be described. Specifically, the same advantageous operations and effects by the same or substantially the same configurations will not be sequentially described for each preferred embodiment.

First Preferred Embodiment

FIG. 1 is a perspective view of a multilayer substrate 101 according to a first preferred embodiment of the present invention. The multilayer substrate 101 includes a stacked body including insulating resin base material layers on which a predetermined conductor pattern is provided. In the present preferred embodiment, a transmission line including two terminal electrodes 11 and a ground conductor 21 is provided.

Figure 2A:
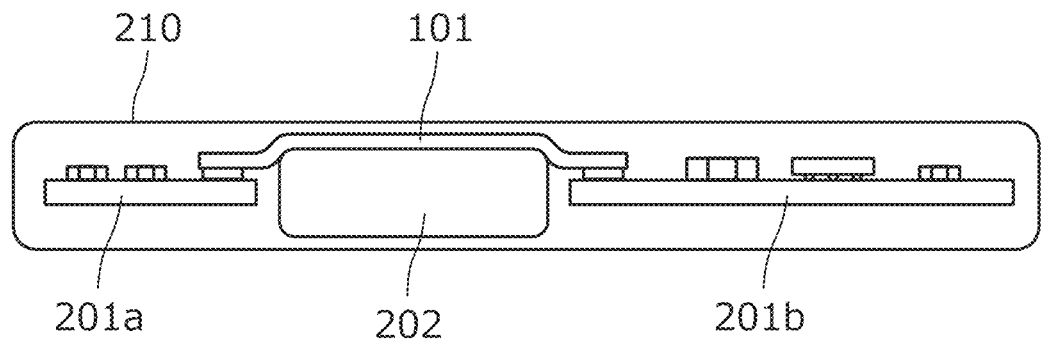
FIG. 2A is a cross-sectional view of a mobile electronic device illustrating a mounting state of the multilayer substrate 101 having a transmission line.
Figure 2B:
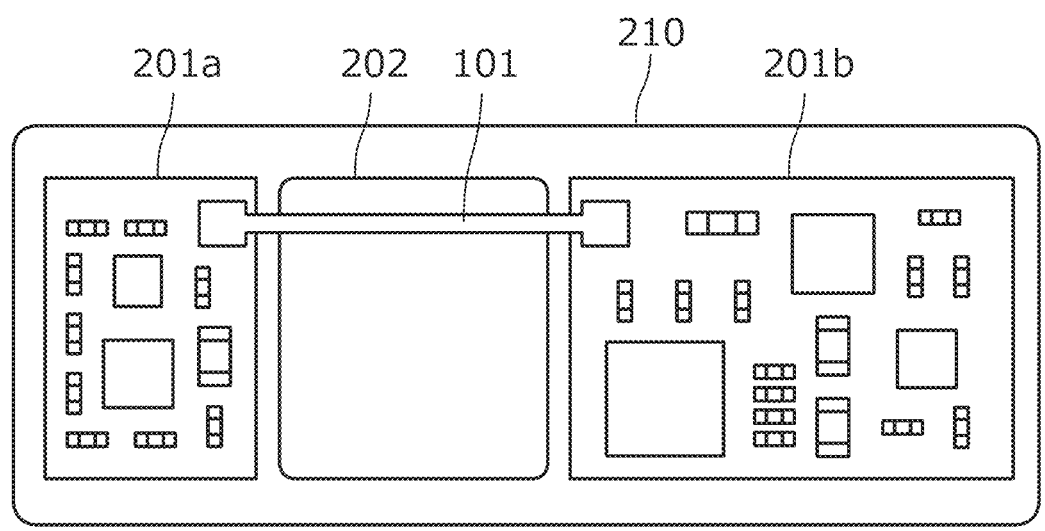
FIG. 2B is a plan view of the inside of a housing of the mobile electronic device.

FIG. 2A is a cross-sectional view of a mobile electronic device illustrating a mounting state of the multilayer substrate 101 including the transmission line, and FIG. 2B is a plan view of the inside of a housing of the mobile electronic device.

A mobile electronic device 301 includes a thin housing 210. In the housing 210, circuit boards 201a and 201b, a battery pack 202, and the like are disposed. Chip components are mounted on the surfaces of the circuit boards 201a and 201b.

Since the multilayer substrate 101 of the present preferred embodiment has flexibility, it is bent along a gap. The multilayer substrate 101 is disposed such that the thickness direction thereof coincides with the thickness direction of the housing 210, such that the multilayer substrate 101 can pass between the battery pack 202 and the housing 210. As a result, the circuit boards 201a and 201b spaced away from one another with the battery pack 202 interposed therebetween can be connected by the multilayer substrate 101.

Hereinafter, a structure and a manufacturing method of the multilayer substrate 101 according to the present preferred embodiment will be described with reference to the drawings.

Figure 3:
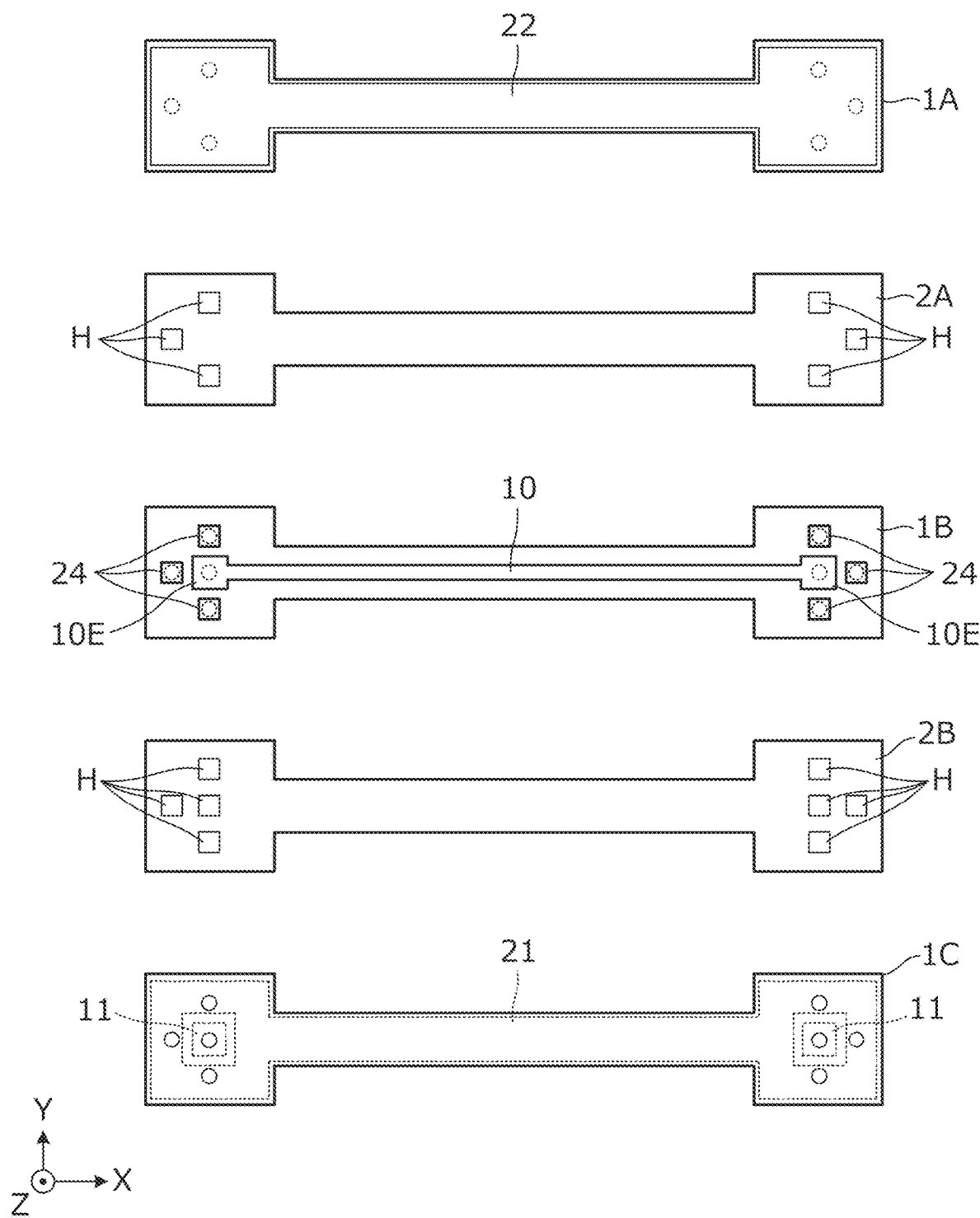
FIG. 3 is a plan view of each layer of a stacked body of the multilayer substrate 101.

FIG. 3 is a plan view of each layer of the stacked body of the multilayer substrate 101. A ground conductor 22 is provided on the upper surface of a first insulating resin base material layer 1A. A circular interlayer connection conductor indicated by a broken line is provided inside the first insulating resin base material layer 1A. An opening H is provided in a second insulating resin base material layer 2A. A signal conductor 10 and an electrode 24 are provided on the upper surface of a first insulating resin base material layer 1B. A circular interlayer connection conductor indicated by a broken line is provided inside the first insulating resin base material layer 1B. The opening H is provided in a second insulating resin base material layer 2B. The ground conductor 21 and the terminal electrode 11 are provided on the lower surface of a first insulating resin base material layer 1C.

When the layers illustrated in FIG. 3 are stacked and heat-pressed at a predetermined temperature (for example, about 300° C.) in a range of, for example, about 180° C. or more and about 320° C. or less, an end 10E of the signal conductor 10 is electrically connected to the terminal electrode 11 via the interlayer connection conductor. The ground conductor 21 and the ground conductor 22 are electrically connected via the interlayer connection conductor and the electrode 24.

Figure 4:
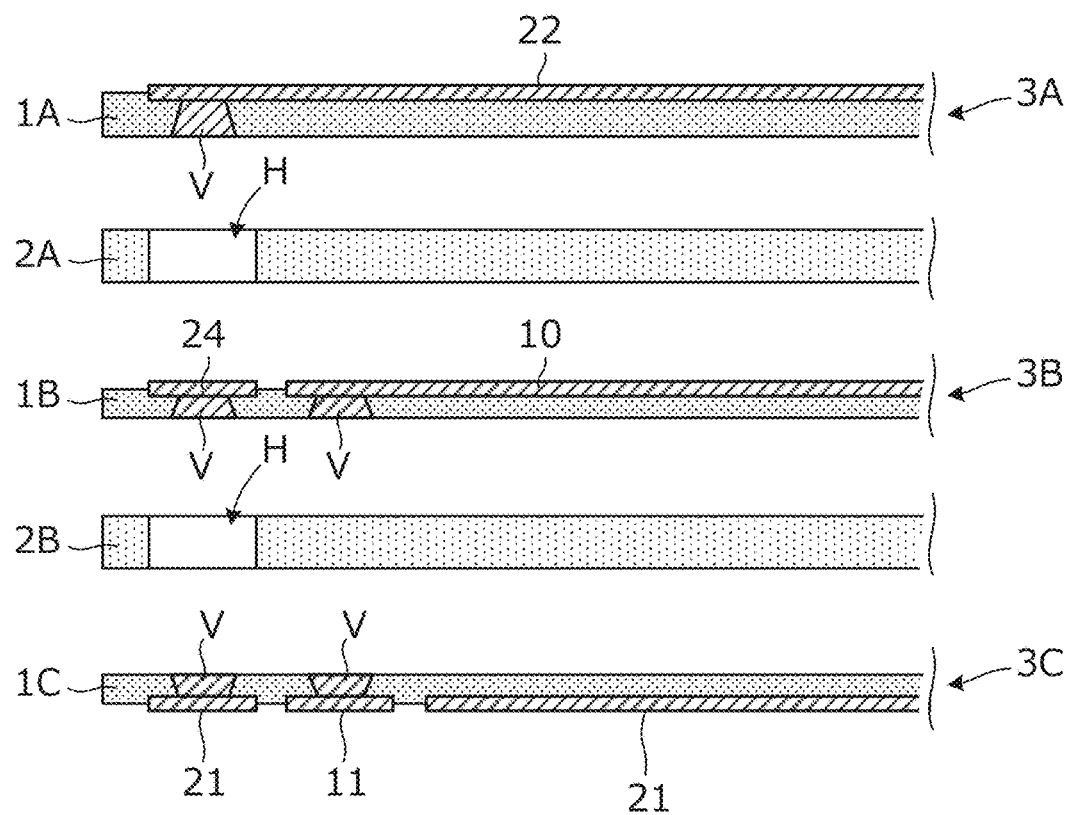
FIG. 4 is a partial cross-sectional view of each layer illustrated in FIG. 3.
Figure 5:
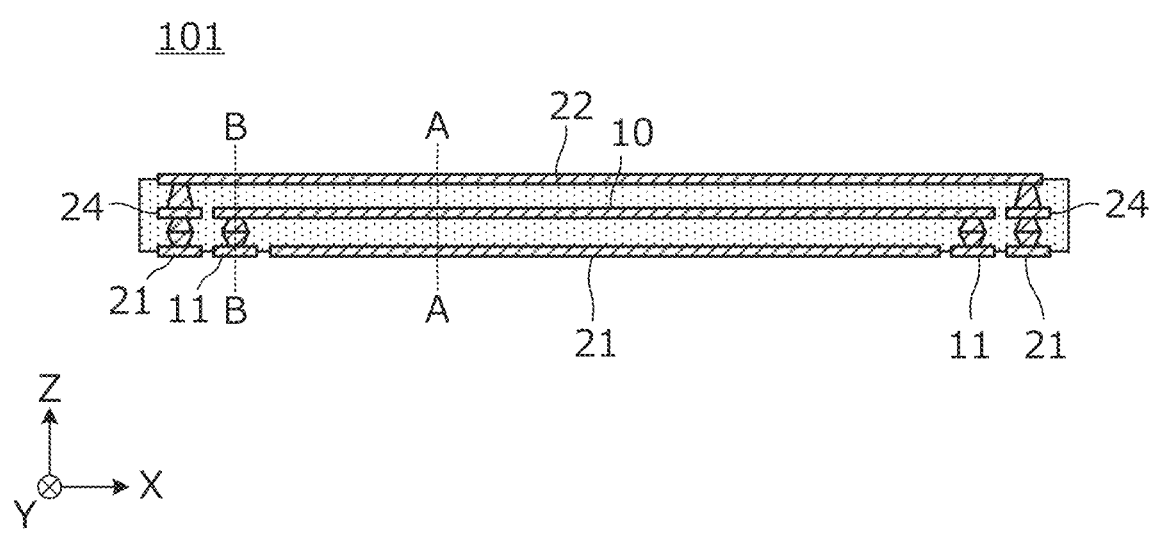
FIG. 5 is a cross-sectional view of the entire multilayer substrate 101.

FIG. 4 is a partial cross-sectional view of each layer illustrated in FIG. 3. FIG. 5 is a cross-sectional view of the entire multilayer substrate 101. A non-limiting example of a method for manufacturing a multilayer substrate according to the present preferred embodiment includes a conductor film-attached insulating resin base material forming step (first step) of configuring conductor film-attached insulating resin base materials 3A, 3B, and 3C with conductor films formed on the first insulating resin base material layers 1A, 1B, and 1C. In the example illustrated in FIG. 4, a copper foil, for example, is attached to the first insulating resin base material layer 1A and patterned by photolithography to form the ground conductor 22. Similarly, a copper foil, for example, is attached to the first insulating resin base material layer 1C and patterned by, for example, photolithography to form the ground conductor 21. In addition, a copper foil, for example, is attached to the first insulating resin base material layer 1B and patterned by, for example, photolithography to form the signal conductor 10 and the electrode 24. In other words, the conductor film-attached insulating resin base material 3B (first conductor film-attached insulating resin base material) with the signal conductor 10 formed on the first insulating resin base material layer 1B is configured.

In the example illustrated in FIG. 4, an interlayer connection conductor V in contact with the ground conductor 22 is formed in the first insulating resin base material layer 1A, the interlayer connection conductor V in contact with the ground conductor 21 is formed in the first insulating resin base material layer 1C, and the interlayer connection conductor V in contact with the electrode 24 and the interlayer connection conductor V in contact with the signal conductor 10 are formed in the first insulating resin base material layer 1B.

The non-limiting example of the method for manufacturing a multilayer substrate according to the present preferred embodiment includes a stacking step of stacking the conductor film-attached insulating resin base materials 3A, 3B, and 3C with the second insulating resin base material layers 2A and 2B interposed therebetween after the conductor film-attached insulating resin base material forming step. In the example illustrated in FIG. 4, the interlayer connection conductor V of the conductor film-attached insulating resin base material 3A and the electrode 24 of the conductor film-attached insulating resin base material 3B are in contact with each other via the opening H of the second insulating resin base material layer 2A. In other words, in the stacking step, the conductor film-attached insulating resin base material 3B (first conductor film-attached insulating resin base material) and the second insulating resin base material layer 2A are stacked such that the signal conductor 10 is in contact with the second insulating resin base material layer 2A. Similarly, the interlayer connection conductor V of the conductor film-attached insulating resin base material 3C and the interlayer connection conductor V of the conductor film-attached insulating resin base material 3B are in contact with each other via the opening H of the second insulating resin base material layer 2B.

Figure 6A:
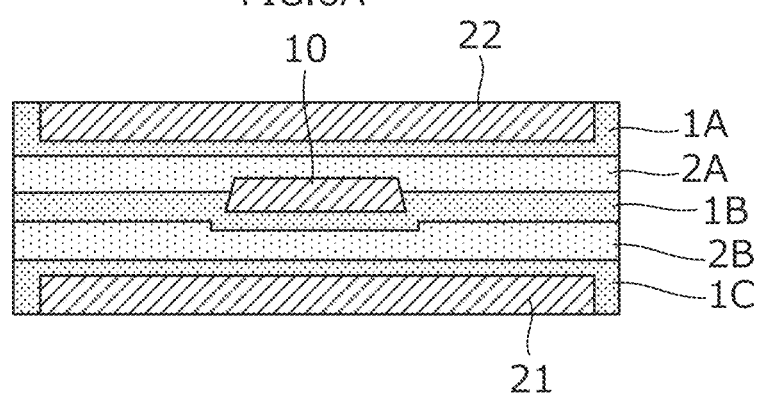
FIG. 6A is a cross-sectional view of the multilayer substrate 101 taken along a plane parallel or substantially parallel to a Y-Z plane in an A-A cross section.
Figure 6B:
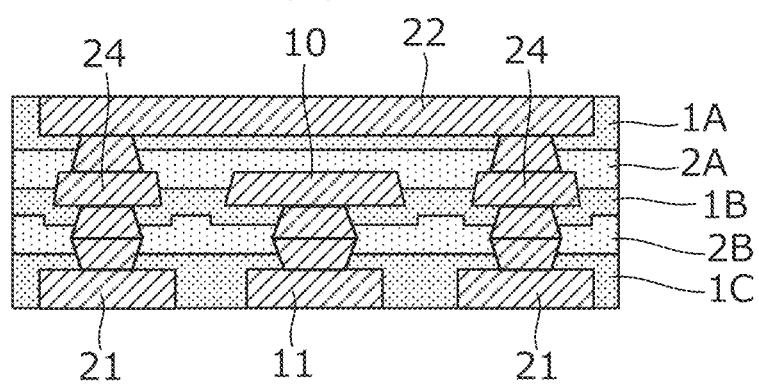
FIG. 6B is a cross-sectional view taken along a plane parallel or substantially parallel to a Y-Z plane in a B-B cross section.

FIG. 6A is a cross-sectional view of the multilayer substrate 101 taken along a plane parallel or substantially parallel to a Y-Z plane in an A-A cross section, and FIG. 6B is a cross-sectional view taken along a plane parallel or substantially parallel to a Y-Z plane in a B-B cross section. The first insulating resin base material layers 1A, 1B, and 1C are flexible resin sheets such as, for example, fluororesin. The second insulating resin base material layers 2A and 2B are resin sheets having flexibility, such as, for example, liquid crystal polymer (LCP) and polyether ether ketone (PEEK).

The adhesion (adhesion strength) of the first insulating resin base material layer (1A, 1B, 1C) to the copper foil is higher than the adhesion (adhesion strength) of the second insulating resin base material layers 2A and 2B to the copper foil. In the examples illustrated in FIGS. 6A, 6B, and 7, the adhesion (adhesion strength) of the first insulating resin base material layer 1B to the signal conductor 10 is higher than the adhesion (adhesion strength) of the second insulating resin base material layer 2A to the signal conductor 10.

According to the above-described manufacturing method, in the stacking step, the signal conductor 10 is not peeled off from the first insulating resin base material layer 1B, and a multilayer substrate with less positional deviation of the signal conductor 10 in the stacked body is obtained. As a result, a multilayer substrate having high stability of electrical characteristics is obtained.

As illustrated in FIGS. 6A and 6B, the ground conductor 22 at one end of the multilayer substrate 101 in the thickness direction is embedded in the first insulating resin base material layer 1A, and the ground conductor 21 at the other end of the multilayer substrate 101 in the thickness direction is embedded in the first insulating resin base material layer 1C. As described above, by embedding the electrode in a first insulating base material, a contact area between the electrode and the first insulating base material can be increased, and a bonding strength can be improved. As described above, the first insulating resin base material layers 1A and 1C have high adhesion (adhesion strength) to the ground conductors 22 and 21, respectively. When the multilayer substrate 101 is bent and used as illustrated in FIG. 2A, stress is likely to be applied to both ends in the thickness direction. However, with the above-described configuration, it is possible to reduce or prevent peeling of the ground conductors 21 and 22. Here, a configuration in which the entire ground conductors 21 and 22 in the thickness direction are embedded is illustrated, but at least a portion thereof may be embedded. However, since it is more preferable that the embedded amount is larger in order to reduce or prevent peeling, the first insulating resin base material layer 1A is preferably thicker than the ground conductor 22, and the first insulating resin base material layer 1C is preferably thicker than the ground conductor 21.

As illustrated in FIG. 6B, the terminal electrode 11 and the terminal electrode of the ground conductor 21 are embedded in the first insulating resin base material layer 1C, except for a joining surface to an external electrode or the like. The first insulating resin base material layer 1C has high adhesion (adhesion strength) to these electrodes. In the terminal electrode joined to an external electrode or the like, stress is likely to be applied, and peeling or joining failure is likely to occur. However, with the above-described configuration, it is possible to reduce or prevent peeling of the terminal electrode 11 and the terminal electrode of the ground conductor 21, and it is also possible to reduce or prevent joining failure due to this. Similarly, since the ground conductor 22 is also embedded in the first insulating resin base material layer 1A, peeling can be reduced or prevented when the ground conductor 22 is used as a terminal electrode, and joining failure due to this can also be reduced or prevented. Although a configuration in which the entire or substantially the entire electrode and conductor in the thickness direction are embedded is illustrated here, at least a portion thereof may be embedded. However, since it is more preferable that the embedded amount is larger in order to reduce or prevent peeling and joining failure, it is preferable that the first insulating resin base material layer 1A is thicker than the ground conductor 22, and the first insulating resin base material layer 1C is thicker than the terminal electrode 11 and the ground conductor 21.

As described above, the ground conductors 21 and 22 and the signal conductor 10 are, for example, a copper foil, and the linear expansion coefficient thereof is, for example, about 17 [ppm/° C.]. The first insulating resin base material layers 1A, 1B, and 1C are, for example, fluororesin, and the linear expansion coefficient thereof is, for example, about 120 [ppm/° C.] in a temperature range from room temperature to a reflow temperature. The second insulating resin base material layers 2A and 2B are, for example, LCP, and the linear expansion coefficient thereof is, for example, about 20 [ppm/° C.] in a temperature range from room temperature to a reflow temperature. Therefore, the difference between the linear expansion coefficient of the ground conductors 21 and 22 and the signal conductor 10 and the linear expansion coefficient of the first insulating resin base material layers 1A, 1B, and 1C is larger than the difference between the linear expansion coefficient of the signal conductor 10 and the linear expansion coefficient of the second insulating resin base material layers 2A and 2B. However, the thickness of each of the first insulating resin base material layers 1A, 1B, and 1C is smaller than the thickness of each of the second insulating resin base material layers 2A and 2B. As a result, internal residual stress caused by the difference in the linear expansion coefficients can be reduce to be small. Therefore, as the material of the first insulating resin base material layers 1A, 1B, and 1C, it is preferable to select adhesion (adhesion strength) to the copper foil rather than the difference in linear expansion coefficients.

Figure 8A:
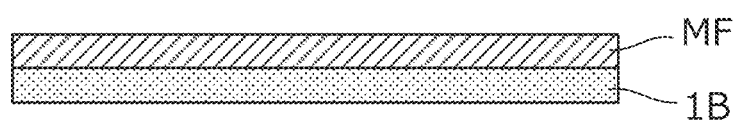
FIGS. 8A and 8B are cross-sectional views illustrating a process of manufacturing a conductor film-attached insulating resin base material.
Figure 8B:
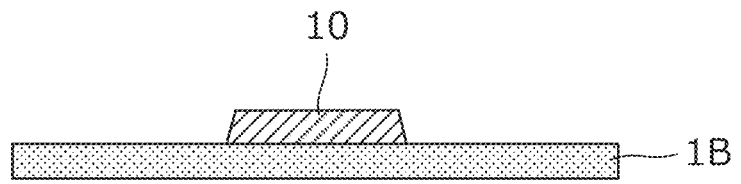

Next, characteristics of the cross-sectional shape of the conductor pattern in the multilayer substrate of the present preferred embodiment will be described with reference to FIGS. 8A and 8B. FIGS. 8A and 8B are cross-sectional views illustrating a process of manufacturing a conductor film-attached insulating resin base material. First, as illustrated in FIG. 8A, a conductor film MF made of, for example, a copper foil is laminated on the first insulating resin base material layer 1B. Thereafter, as illustrated in FIG. 8B, the conductor film MF is patterned by, for example, photolithography to form the signal conductor 10. By this chemical etching of photolithography, a tapered cross-sectional shape is formed on the side in contact with the second insulating resin base material layer 2A.

Since the cross-sectional shape of the signal conductor 10 is the tapered shape, the shape of the insulating resin base material layer around the signal conductor 10 is as illustrated in FIG. 6 by performing stacking and heat pressing. That is, since the signal conductor 10 is partially embedded in the first insulating resin base material layer 1B, the area of the signal conductor 10 in contact with the first insulating resin base material layer 1B is larger than the area of the signal conductor 10 in contact with the second insulating resin base material layer 2A located on the upper surface of the signal conductor 10.

The cross-sectional shape of the signal conductor 10 effectively improves adhesion (adhesion strength) to the first insulating resin base material layer 1B. As a result, positional deviation of the signal conductor 10 is effectively reduced or prevented.

In the multilayer substrate 101 of the present preferred embodiment, since the first insulating resin base material layer 1B has a lower dielectric constant and a lower dielectric loss tangent than the second insulating resin base material layer 2A, loss with respect to a high-frequency signal is reduced or prevented. Moreover, since the contact area between the signal conductor 10 and the first insulating resin base material layer 1B increases as described above, the loss is effectively reduced or prevented.

Second Preferred Embodiment

In a second preferred embodiment of the present invention, a non-limiting example of a method for manufacturing a multilayer substrate including not only a first insulating resin base material layer but also a stacked body including a second insulating resin base material layer will be described.

Figure 9:
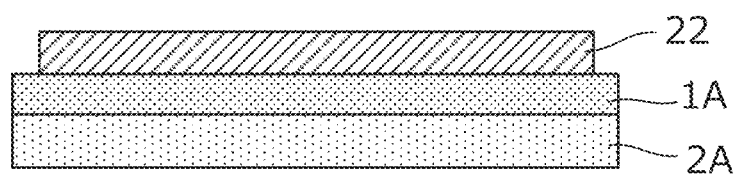
FIG. 9 is a cross-sectional view of a multilayer substrate according to a second preferred embodiment of the present invention taken along a plane perpendicular or substantially perpendicular to the extending direction of a signal conductor before insulating resin base material layers are stacked.
Figure 9:
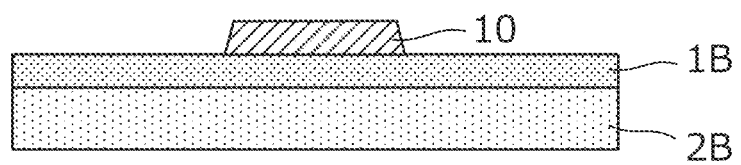
Figure 9:
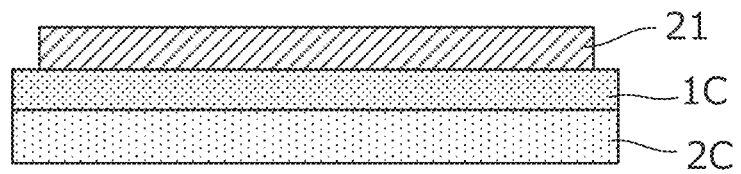
Figure 10:
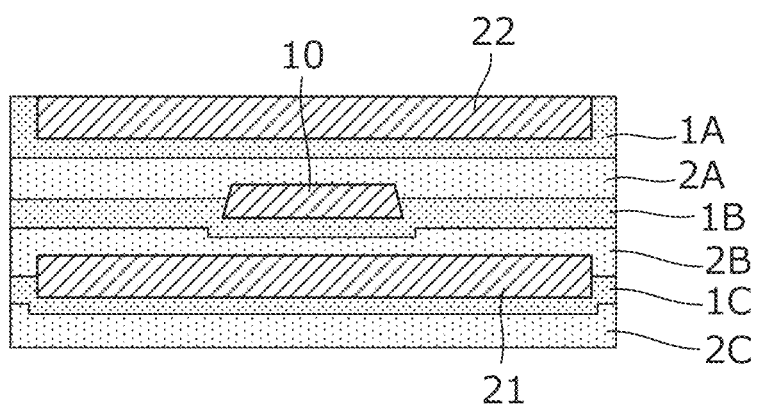
FIG. 10 is a cross-sectional view of the portion illustrated in FIG. 9 after stacking.

FIG. 9 is a cross-sectional view of a multilayer substrate according to the second preferred embodiment taken along a plane perpendicular or substantially perpendicular to the extending direction of the signal conductor before insulating resin base material layers are stacked. FIG. 10 is a cross-sectional view of the portion after stacking.

The ground conductor 22, the first insulating resin base material layer 1A, and the second insulating resin base material layer 2A are stacked in advance. Similarly, the ground conductor 21, the first insulating resin base material layer 1C, and a second insulating resin base material layer 2C are stacked in advance. In addition, the signal conductor 10, the first insulating resin base material layer 1B, and the second insulating resin base material layer 2B are stacked in advance.

In other words, in (a second step of) the conductor film-attached insulating resin base material forming step, in the stacked body including at least the first insulating resin base material layer 1B (in this example, it is configured by the first insulating resin base material layer 1B and the second insulating resin base material layer 2B), the second conductor film-attached insulating resin base material in which the signal conductor 10 is formed on the main surface of the first insulating resin base material layer 1B including the main surface of the stacked body is configured. In the stacking step, the second conductor film-attached insulating resin base material and the second insulating resin base material layer 2A are stacked such that the signal conductor 10 is in contact with the second insulating resin base material layer 2A.

Figure 7:
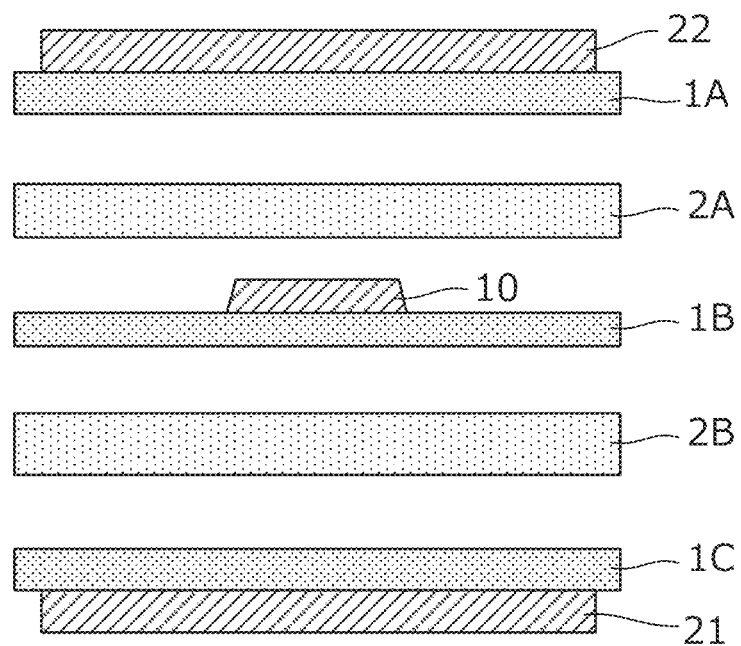
FIG. 7 is a cross-sectional view of the portion illustrated in FIG. 6 before stacking.

Unlike the example illustrated in FIG. 7 in the first preferred embodiment, the ground conductor 21 is provided closer to the signal conductor 10 in the stacking direction than the first insulating resin base material layer 1C. In addition, unlike the first preferred embodiment, the second insulating resin base material layer 2C and the first insulating resin base material layer 1C are stacked.

The first insulating resin base material layers 1A, 1B, and 1C are, for example, sheets of fluororesin or the like, and the second insulating resin base material layers 2A, 2B, and 2C are, for example, sheets of liquid crystal polymer (LCP), polyether ether ketone (PEEK), or the like. Each of the ground conductors 21 and 22 and the signal conductor 10 is formed by patterning a copper foil, for example.

According to the second preferred embodiment, even when the first insulating resin base material layers 1A, 1B, and 10 are thin, they are handled in a stacked body state in which the first insulating resin base material layers 1A, 1B, and 10 and the second insulating resin base material layers 2A, 2B, and 2C are stacked respectively, so that the stacked body (hybrid base material) is hardly damaged.

For example, when, a copper film is used as the conductor film, and, for example, an LCP is used as the second insulating resin base material layer, a fluororesin having higher adhesion to the copper film than the LCP, for example, perfluoro-alkoxyalkane (PFA) or perfluoro-ethylene-propene copolymer (FEP) is used as the first insulating resin base material layer.

Third Preferred Embodiment

In a third preferred embodiment of the present invention, a non-limiting example of a method for manufacturing a multilayer substrate in which a first insulating resin base material layer is provided on both surfaces of a conductor pattern will be described.

Figure 11:
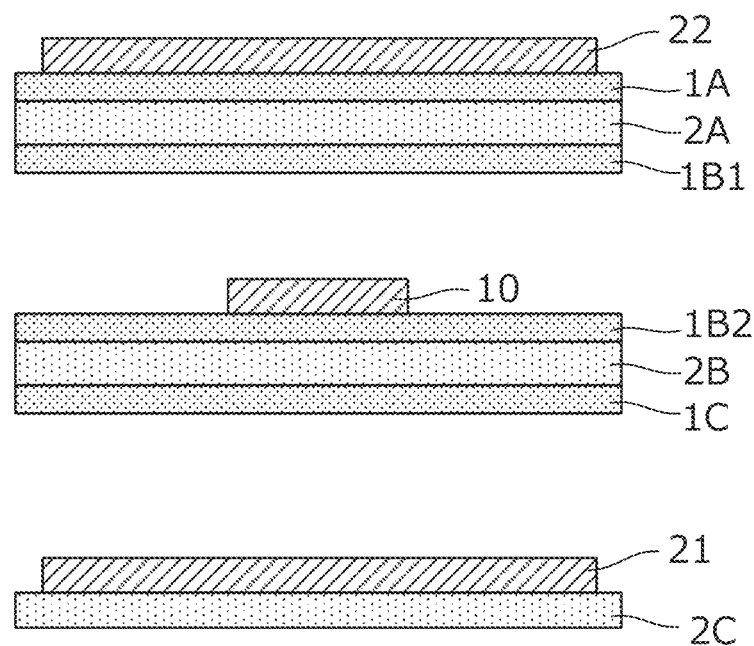
FIG. 11 is a cross-sectional view of a multilayer substrate according to a third preferred embodiment of the present invention taken along a plane perpendicular or substantially perpendicular to the extending direction of a signal conductor before insulating resin base material layers are stacked.
Figure 12:
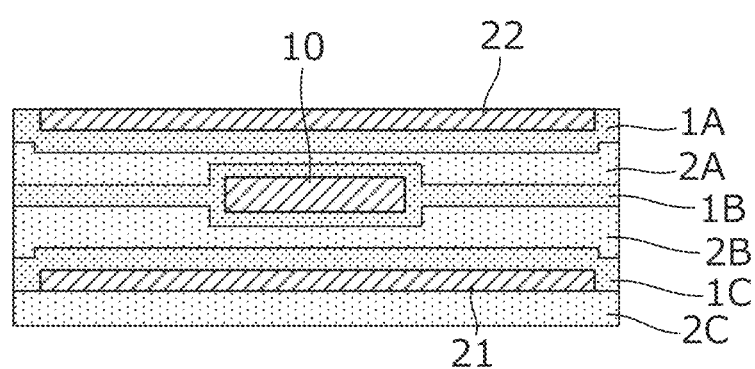
FIG. 12 is a cross-sectional view of the portion illustrated in FIG. 11 after stacking.

FIG. 11 is a cross-sectional view of a multilayer substrate according to a third preferred embodiment taken along a plane perpendicular or substantially perpendicular to the extending direction of the signal conductor before insulating resin base material layers are stacked. FIG. 12 is a cross-sectional view of the portion after stacking.

The first insulating resin base material layer 1A is provided on the upper surface of the second insulating resin base material layer 2A, and a first insulating resin base material layer 1B1 is provided on the lower surface. Similarly, a first insulating resin base material layer 1B2 is provided on the upper surface of the second insulating resin base material layer 2B, and the first insulating resin base material layer 10 is provided on the lower surface.

In FIG. 12, the first insulating resin base material layer 1B is a layer obtained by stacking the first insulating resin base material layers 1B1 and 1B2 illustrated in FIG. 11.

The ground conductor 22 is provided on the upper surface of the first insulating resin base material layer 1A. The signal conductor 10 is provided on the upper surface of the first insulating resin base material layer 1B2. The ground conductor 21 is provided on the upper surface of the second insulating resin base material layer 2C.

As in the first and second preferred embodiments, the first insulating resin base material layers 1A, 1B1, 1B2, and 1C are, for example, sheets of fluororesin or the like, and the second insulating resin base material layers 2A, 2B, and 2C are, for example, sheets of liquid crystal polymer (LCP), polyether ether ketone (PEEK), or the like. Each of the ground conductors 21 and 22 and the signal conductor 10 is formed by patterning a copper foil, for example.

According to the third preferred embodiment, since both surfaces of the signal conductor 10 are covered with the first insulating resin base material layers 1B1 and 1B2, and the surfaces of the ground conductors 21 and 22 are covered with the first insulating resin base material layers 1C and 1A, three insulating resin base material layers are interposed between the signal conductor 10 and each of the ground conductors 21 and 22. Therefore, even when the signal conductor 10 is inclined or deformed in the stacking and heat-pressing processes, the contact between the signal conductor 10 and each of the ground conductors 21 and 22 is effectively reduced or prevented.

Structure of Terminal Portion

Figure 13A:
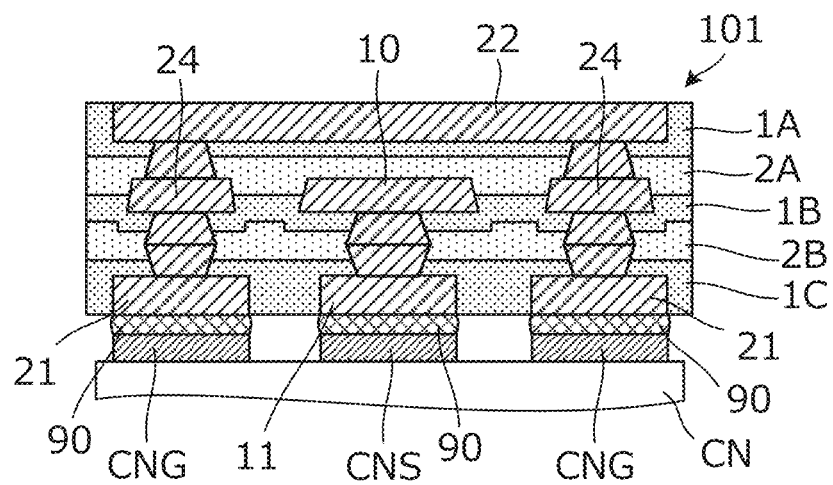
FIGS. 13A and 13B are cross-sectional views of a configuration in which a connector is mounted on a multilayer substrate.
Figure 13B:
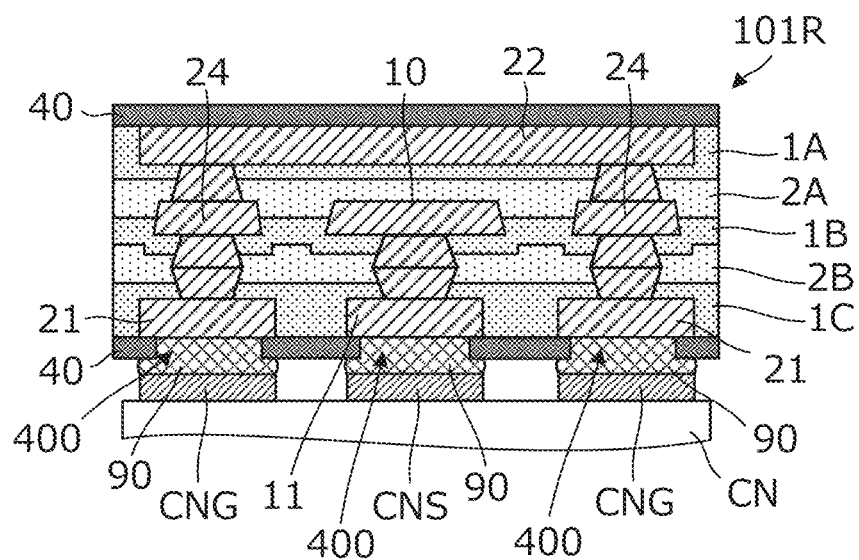

In a case where a connector is mounted on the above-described multilayer substrate, the following configuration is preferable. FIGS. 13A and 13B are cross-sectional views of a configuration in which the connector is mounted on the multilayer substrate.

As illustrated in FIGS. 13A and 13B, a connector CN is disposed such that a signal terminal CNS overlaps the terminal electrode 11 and a grounding terminal CNG overlaps the terminal electrode of the ground conductor 21. Then, the terminal electrode 11 and the signal terminal CNS are joined by a conductive joining material 90 such as solder, for example. Similarly, the terminal electrode of the ground conductor 21 and the grounding terminal CNG are joined by the conductive joining material 90 such as solder, for example.

Here, the terminal electrode 11 and the terminal electrode of the ground conductor 21 overlap the interlayer connection conductor connected thereto in plan view. That is, the portion where the multilayer substrate 101 and the connector CN are joined by the conductive joining material 90 overlaps a portion of the interlayer connection conductor in plan view. As a result, stress on the terminal electrode 11 and the terminal electrode of the ground conductor 21 is reduced or prevented, and peeling is reduced or prevented.

Furthermore, as illustrated in FIG. 13B, by providing a protective film 40 on the surface of a multilayer substrate 101R on the side where the terminal electrode 11 and the ground conductor 21 are provided in the thickness direction, the following advantageous operational effects can be obtained. First, as described above, since the terminal electrode 11 and the terminal electrodes of the ground conductor 21 are embedded in the first insulating resin base material layer 1C, the flatness of the protective film surface can be improved, and a protective film having a low covering property with respect to a step can be easily provided. In addition, by using an overresist in which the terminal electrode 11 and the terminal electrode of the ground conductor 21 are partially covered, it is possible to reduce or prevent peeling of the terminal electrode 11 and the terminal electrode of the ground conductor 21. As illustrated in FIG. 13B, the protective film 40 may be provided on each of both surfaces of the multilayer substrate 101R, but may be provided at least on the surface of the substrate on the side where the terminal electrode 11 and the ground conductor 21 are provided. In this case, an opening 400 is provided at a position at which it overlaps the terminal electrode 11 and the ground conductor 21.

Finally, the description of the above-described preferred embodiments is illustrative in all respects and is not restrictive. Modifications and changes can be made as appropriate by those skilled in the art. For example, partial replacement or combination of configurations illustrated in different preferred embodiments is possible. The scope of the present invention is defined not by the above-described preferred embodiments but by the claims. Furthermore, the scope of the present invention is intended to include all modifications within the meaning and scope equivalent to the claims.

For example, although the multilayer substrate including the stripline transmission line including the signal conductor and the ground conductor has been exemplified, the "conductor film" in preferred embodiments of the present invention is not limited to the signal conductor and the ground conductor, and can also be applied to a multilayer substrate including other conductor patterns. For example, preferred embodiments of the present invention can also be applied to a multilayer substrate used as various electronic components such as, for example, a coil device, an inductor, an antenna, an actuator, and a sensor.

In each of the preferred embodiments described above, one unit of component has been illustrated, but as a matter of course, a process of each step may be performed in a collective board state including a plurality of element forming portions (manufactured by a large-sized process), and the component may be separated into individual pieces at the end.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate comprising:
    a first insulating resin base material layer and a second insulating resin base material layer each including different materials; wherein
    the second insulating resin base material layer is stacked on the first insulating resin base material layer on which a conductor film is formed;
    an adhesion strength between the first insulating resin base material layer and the conductor film is higher than an adhesion strength between the second insulating resin base material layer and the conductor film; and
    a difference between a linear expansion coefficient of the conductor film and a linear expansion coefficient of the first insulating resin base material layer is larger than a difference between a linear expansion coefficient of the conductor film and a linear expansion coefficient of the second insulating resin base material layer.

2. The multilayer substrate according to claim 1, wherein the conductor film is in contact with the first insulating resin base material layer on one surface of the conductor film and in contact with the second insulating resin base material layer on another surface of the conductor film; and
an area of the conductor film in contact with the first insulating resin base material layer is larger than an area of the conductor film in contact with the second insulating resin base material layer.

3. The multilayer substrate according to claim 1, wherein the conductor film includes a portion sandwiched between a plurality of the first insulating resin base material layers in a stacking direction.

4. The multilayer substrate according to claim 1, wherein a thickness of the first insulating resin base material layer is smaller than a thickness of the second insulating resin base material layer.

5. The multilayer substrate according to claim 1, wherein the conductor film is in contact with the first insulating resin base material layer on one surface of the conductor film and in contact with the second insulating resin base material layer on another surface of the conductor film; and
the one surface overlaps the another surface when viewed in the stacking direction.

6. The multilayer substrate according to claim 1, wherein the first insulating resin base material layer is made of fluororesin.

7. The multilayer substrate according to claim 1, wherein the conductor film is a copper film.

8. The multilayer substrate according to claim 1, wherein the second insulating resin base material layer is made of liquid crystal polymer or polyether ether ketone.

9. The multilayer substrate according to claim 1, wherein the conductor film has a tapered cross-section shape.

10. A multilayer substrate comprising:
a first insulating resin base material layer and a second insulating resin base material layer each including different materials; wherein
the second insulating resin base material layer is stacked on the first insulating resin base material layer on which a conductor film is formed;
an adhesion strength between the first insulating resin base material layer and the conductor film is higher than an adhesion strength between the second insulating resin base material layer and the conductor film; and
a thickness of the first insulating resin base material layer is smaller than a thickness of the second insulating resin base material layer.

* * * * *